(12) United States Patent
Tajima et al.

(10) Patent No.: US 8,519,256 B2
(45) Date of Patent: Aug. 27, 2013

(54) THERMOELECTRIC MATERIAL, THERMOELECTRIC ELEMENT, THERMOELECTRIC MODULE AND METHOD FOR MANUFACTURING THE SAME

(75) Inventors: Kenichi Tajima, Kirishima (JP); Koichi Tanaka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 65 days.

(21) Appl. No.: 13/227,314

(22) Filed: Sep. 7, 2011

(65) Prior Publication Data

US 2011/0315182 A1 Dec. 29, 2011

Related U.S. Application Data

(62) Division of application No. 10/570,569, filed as application No. PCT/JP2004/012190 on Aug. 25, 2004, now Pat. No. 8,035,026.

(30) Foreign Application Priority Data

Aug. 26, 2003 (JP) ................................. 2003-302189

(51) Int. Cl.
*H01L 35/16* (2006.01)
(52) U.S. Cl.
USPC .......................................... 136/240; 136/238
(58) Field of Classification Search
USPC ....................................... 136/236.1, 238, 240
See application file for complete search history.

(56) References Cited

U.S. PATENT DOCUMENTS

| | | | |
|---|---|---|---|
| 6,043,424 A | 3/2000 | Horio et al. | |
| 6,307,143 B1 | 10/2001 | Horio et al. | 136/240 |
| 6,444,894 B1 | 9/2002 | Sterzel | |
| 2002/0100499 A1 | 8/2002 | Hayashi et al. | 136/238 |
| 2003/0234037 A1 | 12/2003 | Tanaka | 136/205 |

FOREIGN PATENT DOCUMENTS

| | | |
|---|---|---|
| EP | 0 476 134 | 6/1990 |
| JP | 64-037456 | 2/1989 |
| JP | 01-106478 | 4/1989 |
| JP | 03-016281 | 1/1991 |
| JP | 03-056604 | 3/1991 |
| JP | 05-055640 | 3/1993 |
| JP | 08-032588 | 3/1996 |
| JP | 08-111546 | 4/1996 |
| JP | 09-008364 | 1/1997 |
| JP | 09-018060 | 1/1997 |
| JP | 09-074229 | 3/1997 |
| JP | 09-214006 | 8/1997 |

(Continued)

OTHER PUBLICATIONS

Nakahara, JP 2002026404 English machine translation, 2002, 1-8.*

(Continued)

*Primary Examiner* — Miriam Berdichevsky
(74) *Attorney, Agent, or Firm* — DLA Piper LLP (US)

(57) ABSTRACT

T provide an N type thermoelectric material having figure of the merit improved to be comparable to or higher than that of P type thermoelectric material, the N type thermoelectric material of the present invention contains at least one kind of Bi and Sb and at least one kind of Te and Se as main components, and contains bromine (Br) and iodine (I) to have carrier in such a concentration that corresponds to the contents of bromine (Br) and iodine (I).

7 Claims, 1 Drawing Sheet

(56) References Cited

FOREIGN PATENT DOCUMENTS

| | | |
|---|---|---|
| JP | 09-214007 | 8/1997 |
| JP | 09-289339 | 11/1997 |
| JP | 09-321347 | 12/1997 |
| JP | 10-051037 | 2/1998 |
| JP | 10-074984 | 3/1998 |
| JP | 10-275944 | 10/1998 |
| JP | 11-284237 | 10/1999 |
| JP | 2000-036627 | 2/2000 |
| JP | 2000-106460 | 4/2000 |
| JP | 2001-223392 | 8/2001 |
| JP | 2002-026404 | 1/2002 |
| JP | 2002-164584 | 6/2002 |
| JP | 2002-223013 | 8/2002 |
| JP | 2002-232024 | 8/2002 |
| JP | 2002-232025 | 8/2002 |
| JP | 2002-232026 | 8/2002 |
| JP | 2002-237223 | 11/2002 |
| JP | 2002-327223 | 11/2002 |
| JP | 2003-069090 | 3/2003 |

OTHER PUBLICATIONS

Hayashi, JP 2002232026 English machine translation, 2002, 1-16.*

* cited by examiner

THERMOELECTRIC MATERIAL, THERMOELECTRIC ELEMENT, THERMOELECTRIC MODULE AND METHOD FOR MANUFACTURING THE SAME

CROSS-REFERENCE TO THE RELATED APPLICATIONS

This application is a divisional of application Ser. No. 10/570,569 filed Nov. 29, 2006, which is a national phase of PCT application PCT/JP2004/012190 filed on Aug. 25, 2004, which claims priority to Japanese Patent Application No. 20003-302189 filed on Aug. 26, 2003, the contents of which are incorporated by reference in their entirety.

TECHNICAL FIELD

The present invention relates to a thermoelectric module used for cooling a heat generating device such as semiconductor and in various cooling devices, a thermoelectric element installed in the thermoelectric module, a thermoelectric material used in the thermoelectric element, and methods for manufacturing the same.

BACKGROUND ART

Thermoelectric modules, that utilize the Peltier effect to generate heat at one end thereof and absorbs heat from the environment on the other end when electric current flows therein, have been used in cooling applications. The thermoelectric module is envisioned to be particularly promising in such applications as temperature control for laser diode, portable refrigerator, thermostat, photo-detector device and semiconductor manufacturing apparatus. Recently, application of the thermoelectric module to refrigerator and air conditioner for home use is studied vigorously, because of such advantages as the capability to operate without fluorocarbon, vibration nor noise.

A thermoelectric module used for cooling application at a temperature near the normal temperature comprises a plurality of pairs of P type and N type thermoelectric elements connected in series. The thermoelectric module designed for cooling application usually employs thermoelectric elements made from $A_2B_3$ type crystal (A represents Bi and/or Sb, and B represents Te and/or Se) for the reason of high cooling performance.

For the P type thermoelectric element, solid solution of $Bi_2Te_3$ (bismuth telluride) and $Sb_2Te_3$ (antimony telluride) is mainly used and, for the N-type thermoelectric element, solid solution of $Bi_2Te_3$ and $Bi_2Se_3$ (bismuth selenide) with n-type impurity, namely a dopant aimed at controlling the carrier concentration added thereto is proposed. As the dopant for adjusting carrier concentration, it has been proposed to use at least one kind selected from among a group consisting of Ag, Cu and halogen and halide of Ag, Cu or other metal (see, for example, "Thermoelectric Semiconductor" edited by YOSHIO KAN, Maki-Shoten Publishing Co., Jul. 25, 1966, p 346; Japanese Unexamined Patent Publication (Kokai) No. 1-37456; Japanese Unexamined Patent Publication (Kokai) No. 10-51037; and Japanese Unexamined Patent Publication (Kokai) No. 12-36627).

Such a dopant for adjusting carrier concentration substitutes on Te/Se atom that has different valency and forms a solid solution while releasing electron. The $A_2B_3$ type crystal (A represents Bi and/or Sb, and B represents Te and/or Se) is believed to turn into an N type semiconductor when such an impurity is added thereto. A thermoelectric element is made of a thermoelectric crystalline material, and has thermoelectric characteristic that is represented by figure of merit Z. The figure of merit Z is defined as $Z=S^2/\rho k$ where S is Seebeck coefficient, $\rho$ is resistivity and k is thermal conductivity, and indicates the performance and efficiency of the thermoelectric crystalline material when it is used as a thermoelectric element. Higher the value of the figure of merit Z of a material, the higher the cooling performance and efficiency of the thermoelectric module that uses the material become.

The compositions and methods described in the documents cited above, however, there has been such a problem that the N type thermoelectric material has a lower figure of merit than that of the P type thermoelectric material. Therefore, when the P-type and N-type thermoelectric crystalline material are used together to make a cooling element, the element has low cooling performance and low efficiency and cannot be readily applied to refrigerator for home use. Thus there is a demand for great improvement in the figure of merit of the material in order to extend the applications of the material to refrigerators for home use and the like.

As a method for manufacturing the thermoelectric crystalline material from $A_2B_3$ type crystal, it has been proposed to crush an alloy, that has been made by melting a mixed powder of Bi, Sb, Te, Se, etc. and solidifying it, into alloy powder and sinter the alloy powder under a pressure by hot press or other process (see, for example, Japanese Unexamined Patent Publication (Kokai) No. 8-32588; and Japanese Unexamined Patent Publication (Kokai) No. 1-106478).

According to the method described in Japanese Unexamined Patent Publication (Kokai) No. 8-32588 and Japanese Unexamined Patent Publication (Kokai) No. 1-106478, the melt-refined alloy is first obtained and is classified by the size of the alloy particles, followed by heat treatment to make it even and sintering under a pressure by hot press or the like. It is claimed that this method enables it to decrease the specific resistance of the sintering material by forming the crystal oriented in the sintered material, so that the figure of merit is improved as the thermal conductivity decreases due to the effect of the grain boundary of the polycrystalline structure of the sintered material.

According to Japanese Unexamined Patent Publication (Kokai) No. 8-32588 and Japanese Unexamined Patent Publication (Kokai) No. 1-106478, however, values of the figure of merit of the thermoelectric materials made from these sintered materials are about $2.8\times10^{-3}$/K at the best, and the material can be used as a cooling element but has low levels of cooling performance and efficiency, thus restricting its applications and making it difficult to use in a refrigerator for home use. Thus there is a demand for great improvement in the figure of merit of the material in order to extend the applications of the material to refrigerator for home use and the like.

As a method to obtain a thermoelectric material having high value of figure of merit, it is proposed to manufacture an ingot of well oriented crystal or a crystalline material that is proximate to single crystal, through directional solidification based on a known method of manufacturing single crystal such as Bridgman method, pulling (CZ) method or zone-melt method. Since a directionally solidified thermoelectric crystalline material consisting mainly of the $A_2B_3$ type crystal (A represents Bi and/or Sb, and B represents Te and/or Se) has the axis of easy crystallization on the a axis, the c plane perpendicular to the c axis becomes parallel to the direction of growth by the directional solidification. In addition, the specific resistance is far lower along the c plane than along the a axis, while Seebeck coefficient and thermal conductivity show less anisotropy, namely less dependence on the crystal orientation. As a result, specific resistance of the directionally solidified thermoelectric crystalline material, when electric current flows along the c plane, can be made much lower than that of a sintered material, thus achieving a higher figure of merit than the sintered material (see, for example, "Thermoelectric Semiconductor and its Applications" Kinichi UEMURA, Isao NISHIDA, THE NIKKAN KOGYO SHIMBUN CO., LTD., Dec. 20, 1988, p 149).

However, the directionally solidified thermoelectric crystalline material such as that described in "Thermoelectric Semiconductor" edited by YOSHIO KAN, Maki-Shoten Publishing Co., Jul. 25, 1966, p 346 has properties resembling those of a single crystal, with the crystal orientation and crystal size being substantially uniform. As a result, means for improving the figure of merit are restricted to adjustment of the composition and optimization of the conditions of directional solidification which, even when carried out, can achieve an insignificant improvement in the figure of merit. Thus attempts to improve the figure of merit of the directionally solidified thermoelectric crystalline material have come to the limit of the prior art.

This limitation is partly due to the high thermal conductivity of the directionally solidified thermoelectric crystalline material. That is, since the directionally solidified thermoelectric crystalline material is constituted from well oriented crystal, there are less grain boundaries and the possibility of phonon dispersion that occurs in a sintered material due to grain boundary is eliminated, thus resulting in high thermal conductivity. As a result, although Seebeck coefficient can be improved and specific resistance can be decreased, thermal conductivity becomes higher at the same time, resulting in insignificant improvement in the figure of merit. Thus improvement of the figure of merit of the directionally solidified thermoelectric crystalline material of the prior art has been limited to about $3 \times 10^{-3}$/K due to high thermal conductivity.

It has also been proposed to greatly improve the thermoelectric characteristic by sintering a powder of solid solution that contains antimony under pressure, in such a process as hot press to form a sintered material of high density that cannot be obtained by sintering under normal pressure, with theoretical density ratio of 97% (see, for example, Japanese Unexamined Patent Publication (Kokai) No. 1-106478).

Better mechanical properties than those of the melt-refined materials can be obtained by the use of the hot press process, although improvements of the characteristics are hampered by the oxidation of the stock material powder. To counter this problem, a method of manufacturing a thermoelectric material having uniform particle size and high thermoelectric performance has been disclosed where a heat treatment process is applied to remove fine particles that are more likely to be oxidized from a stock material powder, and the powder of solid solution having particle size in a range from 10 to 200 μm is sintered (see, for example, Japanese Unexamined Patent Publication (Kokai) No. 3-016281).

Also such a method is proposed as a powder of solid solution alloy is made by liquid quenching process, subjecting the powder to reduction treatment in hydrogen atmosphere, and firing the powder under pressure so as to decrease the oxygen content to 1500 ppm or less and improve the thermoelectric performance (see, for example, Japanese Unexamined Patent Publication (Kokai) No. 10-074984).

As a method of removing oxygen that deposits on the surface of the material, it has been proposed to temporarily forming a thermoelectric crystalline material that contains at least two elements selected from among a group consisting of Bi, Te, Se and Sb, calcinate the material at a temperature lower than the firing temperature under a reduced pressure, and apply heat treatment to the calcined material in reducing atmosphere that contains hydrogen (see, for example, Japanese Unexamined Patent Publication (Kokai) No. 9-18060).

Furthermore, it has been shown that, when discharge plasma is generated by applying a voltage directly to a powder so as to activate the surface of the powder and the powder is sintered under a pressure while removing the oxide layer and the adsorbed gas, adverse effect of the adsorbed gas can be reduced and variation in the characteristics of the thermoelectric element can be suppressed (see, for example, Japanese Unexamined Patent Publication (Kokai) No. 5-55640).

However, the thermoelectric material described in Japanese Unexamined Patent Publication (Kokai) No. 3-016281 has such a problem that heat treatment for removing fine particles is applied in the state of powder that has particle size in a range from 10 to 200 μm, and therefore the strength decreases. There has also been such a problem that tendency of the powder to coagulate increases after the heat treatment which results in a longer time taken to insert the powder for sintering and the performance varies depending on the degree of coagulation, while the sintered material thus obtained has lower strength.

The method of manufacturing the thermoelectric material described in Japanese Unexamined Patent Publication (Kokai) No. 10-074984 has such a problem that, in addition to the necessity to sinter the powder, that has been subjected to heat treatment, under a pressure similarly to the case of patent document 2, it is not suited to mass production because the liquid quenching process that requires a special facility is employed, and the characteristic becomes unstable depending on the method of pressurized sintering, thus difference is likely to occur between the inside and the outside.

In the case of the method of manufacturing the thermoelectric material described in Japanese Unexamined Patent Publication (Kokai) No. 9-18060, since the stock material is prepared in a short period of time, quantity of oxygen in the material can be reduced, although a number of processes are involved and the processes are complicated, while performance cannot be improved sufficiently.

In the case of the method of manufacturing the thermoelectric material described in Japanese Unexamined Patent Publication (Kokai) No. 5-55640, since the powder is sintered while removing oxygen that has deposited on the surface of the particles of the stock material powder, though there is an effect of reducing the cost, it is difficult to achieve sufficient reduction of oxygen in the green compact and it is difficult to improve the performance, and the characteristic is unstable with difference likely to occur between the inside and the outside.

Thus with the methods of manufacturing the thermoelectric element of the prior art, the methods are simple but satisfactory performance cannot be achieved, or it has been difficult to obtain a thermoelectric material that has favorable property for mass production and high performance at the same time.

As described above, although the thermoelectric material is required to have the figure of merit greatly improved, thermoelectric materials of the prior art have low values of figure of merit and there have been limitation on expanding the applications of the thermoelectric element made by using the thermoelectric material and the thermoelectric module.

The thermoelectric materials of the prior art also have such a problem that tendency of the powder to coagulate increases after the heat treatment which results in a longer time taken to charge the powder for sintering and the performance varies depending on the degree of coagulation, while the sintered material thus obtained has a low strength.

DISCLOSURE OF THE INVENTION

A first object of the present invention is to provide an N type thermoelectric material having figure of the merit improved to be comparable to or higher than that of P type thermoelectric material, a method for manufacturing the same and a thermoelectric element.

A second object of the present invention is to provide a directionally solidified thermoelectric crystalline material that has the figure of merit improved by decreasing the thermal conductivity and a method for manufacturing the same, a thermoelectric element and a thermoelectric module that has greatly improved cooling performance and cooling efficiency.

A third object of the present invention is to provide a thermoelectric material having high strength and high thermoelectric characteristic and a method for manufacturing the thermoelectric material having high performance with high productivity.

The N type thermoelectric material of the present invention is characterized in that it contains at least one kind of Bi and Sb and at least one kind of Te and Se as main components, contains bromine (Br) and iodine (I) and has carrier in such a concentration that corresponds to the contents of bromine (Br) and iodine (I).

With the N type thermoelectric material of the present invention having the constitution described above, since both bromine (Br) and iodine (I) are contained as dopant for adjusting carrier concentration, electron density can be made uniform so as to mitigate the cause of impeding the electron mobility, and therefore the figure of merit can be improved by decreasing the specific resistance.

In the N type thermoelectric material of the present invention, ratio of the number of atoms of Br to I (Br/I) that are dopants for adjusting carrier concentration is preferably in a range from 1 to 100 inclusive. When the ratio of the number of atoms of Br to I is set in this range, electron density can be made more uniform and the figure of merit can be improved further.

The N type thermoelectric element of the present invention is characterized by such a constitution as positive and negative electrodes are separately formed on an N type thermoelectric member made of the N type thermoelectric material of the present invention, and that the N type thermoelectric member is formed from uniaxially oriented crystal so that electrons move in the direction of crystal orientation.

With the N type thermoelectric element of the present invention having the constitution described above, since electrons move the direction of uniaxial crystal orientation, electric current can be caused to flow in the direction of lower specific resistance, thus improving the figure of merit of the element.

Plane Orientation Degree

In the N type thermoelectric material of the present invention, the degree of preferred orientation of the uniaxial orientation in the c plane is preferably 70% or higher, which makes it possible to decrease the specific resistance and improve the figure of merit of the element further.

The method of manufacturing the N type thermoelectric material according to the present invention contains a process of adding at least one of antimony tribromide ($SbBr_3$) and mercury dibromide ($HgBr_2$) and antimony triiodide ($SbI_3$) at the same time as the dopants for adjusting the carrier concentration, when making the thermoelectric material that contains at least one kind of Bi and Sb and at least one kind of Te and Se as main components.

According to the method of manufacturing the N type thermoelectric material of the present invention described above, evaporation of the dopant can be prevented and fluctuation of the figure of merit can be suppressed, so as to provide the N type thermoelectric material having higher figure of merit.

In the method of manufacturing the thermoelectric material according to the present invention, ratio of the number of atoms of Br to I (Br/I) is preferably in a range from 1 to 100 inclusive.

The directionally solidified thermoelectric crystalline material according to the present invention has been realized on the basis of finding that, when a trace of a boron compound is contained in a directionally solidified thermoelectric crystalline material that has near-single crystal quality, it is made possible to decrease the thermal conductivity without changing the Seebeck coefficient and specific resistance, so that the figure of merit can be improved.

Specifically, the directionally solidified thermoelectric crystalline material according to the present invention is a thermoelectric crystalline material made of uniaxially oriented crystal that contains at least two kinds selected from among Bi, Sb, Te and Se, in which a boron (B) compound is added. Including the boron compound causes dispersion of phonon and decrease in thermal conductivity, thus making it possible to greatly improve the figure of merit. As a result, such a directionally solidified thermoelectric crystalline material can be provided that allows it to achieve high performance of thermoelectric module.

The boron compound is preferably either nitride, carbide or oxide.

The content of the boron compound is preferably in a range from 0.01 to 0.5% by weight in terms of boron element. By controlling the kind and content of the boron compound as described above, it is made possible to efficiently decrease only the thermal conductivity while maintaining Seebeck coefficient and specific resistance constant, and improve the figure of merit.

Also when either nitride, carbide or oxide is used as the boron compound and the content of the boron compound is controlled in a range from 0.01 to 0.5% by weight in terms of boron element, it is made possible to efficiently decrease only the thermal conductivity while maintaining Seebeck coefficient and specific resistance constant, and improve the figure of merit further.

The method of manufacturing the directionally solidified thermoelectric crystalline material according to the present invention comprises a process of preparing an alloy powder by crushing a melt-refined alloy that contains at least two kinds selected from among a group consisting of Bi, Sb, Te and Se, and a process of preparing a boron-containing alloy powder by mixing the alloy powder with a powder or slurry of the boron compound that contains at least one kind of boron nitride (BN), boron carbide ($B_4C$) and boron oxide ($B_2O_3$).

According to the method of manufacturing the directionally solidified thermoelectric crystalline material of the present invention, by including such processes as described above, it is made possible to cause the boron compound to remain efficiently, so that the effect of the component to decrease the thermal conductivity can be achieved effectively. It is particularly preferable that total content of the boron compounds is in a range from 0.01 to 0.5% by weight in terms of boron element. This makes it possible to efficiently decrease only the thermal conductivity and improve the figure of merit.

In the method of manufacturing the directionally solidified thermoelectric crystalline material of the present invention, it is preferable that such a process is included as the boron-containing alloy powder mixed with the boron compound described above is melted and poured into a mold that has a void measuring 10 mm² or less in cross sectional area and 50 mm or more in length, so as to grow a crystal by directional solidification while cooling. By using the mold having small cross sectional area, it is made possible to disperse the boron compound uniformly in the thermoelectric crystalline material, thereby to stabilize the improved performance.

The thermoelectric element of the present invention is obtained by cutting the directionally solidified thermoelectric crystalline material that contains the boron compound and at least two kinds selected from among Bi, Sb, Te and Se. Thus the thermoelectric element having high cooling performance can be obtained.

The thermoelectric module of the present invention comprises a support substrate, a plurality of thermoelectric elements disposed on the support substrate, wiring conductors that electrically conduct the plurality of thermoelectric elements with each other and terminals that are mounted on the support substrate and are electrically connected to the wiring conductors, wherein the thermoelectric elements are obtained by cutting the directionally solidified thermoelectric crystalline material that contains a boron compound. The thermoelectric module having high cooling performance and high efficiency can be obtained by using the thermoelectric elements.

While the powder of solid solution alloy is fired in a carbon mold in the pressurized firing method of the prior art, the present invention has been made on the basis of finding that mixing of carbon into the sintered material leads to degradation of the characteristics, an increase in the density of a sintered material, that is obtained by firing in reducing atmosphere under normal pressure, in a short period of time by supplying pulsed electric current makes it possible to greatly reduce the amount of carbon that mixes into the sintered material and decrease the quantity of oxygen, thereby to produce the thermoelectric material that has high strength despite fine structure and has high thermoelectric characteristics.

The thermoelectric material of the present invention is a dense material that contains at least two kinds selected from among Bi, Sb, Te and Se, wherein mean particle size of the dense material is 30 μm or less and carbon content and oxygen content are each not higher than 0.3% by weight.

By using the thermoelectric material of the present invention as described above, it is made possible to make a sintered thermoelectric material that has high strength and high thermoelectric characteristic despite fine structure.

Relative density of the dense material is preferably 98% or higher. This enables it to further improve the characteristic of the thermoelectric element.

According to the method of manufacturing the thermoelectric material of the present invention, a green compact is formed from an alloy powder that contains at least two kinds selected from among Bi, Sb, Te and Se and has mean particle size of 30 μm or less, the green compact is fired under normal pressure to make a normal pressure-sintered material and densification treatment is applied to the normal pressure-sintered material thereby to make the dense material. This method makes it possible to suppress the quantities of carbon and oxygen mixed into the normal pressure-sintered material and suppress the growth of grains at the same time. As a result, such a material can be obtained, with a method capable of achieving high productivity, that has high strength and high thermoelectric performance and can be used in a thermoelectric module for cooling or power generation applications.

It is particularly preferable that firing temperature of the firing under normal pressure is not lower than the processing temperature of the densification treatment. This makes it possible to reliably cause material transfer between particles by sintering under normal pressure so as to accelerate sintering between the particles, and suppress the grain growth by setting the densification temperature lower than the firing temperature, thereby to easily achieve high strength.

It is preferable that the densification treatment is carried out by supplying pulsed electric current for heating. By directly supplying pulsed electric current for heating, it is made possible to improve the energy efficiency, carry out quick heating, reduce the heat treatment time, effectively prevent impurity from mixing in, prevent partial overheat and carry out uniform temperature control.

Densification by supplying pulsed electric current makes it possible to suppress the quantities of carbon and oxygen mixed into the normal pressure-sintered material, maintain fine structure and easily manufacture the thermoelectric element.

It is preferable the densification treatment to be accompanied by pressurization. This accelerates the densification and easily achieves the densification treatment in a shorter period of time.

In the densification treatment, it is preferable that the period during which the normal pressure-sintered material is exposed to a temperature of 200° C. or higher is not longer than 1 hour. By ending the heating in the densification treatment in a short period within 1 hour, it is made possible to decrease the quantities of carbon and oxygen mixed into the normal pressure-sintered material.

It is also preferable to set the firing temperature of the firing under the normal pressure in a range from 300 to 550° C. Such a firing temperature makes it possible to sinter the thermoelectric material that contains at least two kinds selected from among Bi, Sb, Te and Se so as to bind the particles together, and prevent decomposition or quick growth of grains.

It is preferable that the atmosphere of the firing under normal pressure is reducing atmosphere, particularly a gas that contains at least hydrogen. Such an atmosphere of reducing gas, particularly hydrogen atmosphere, has a great effect of removing oxygen.

It is also preferable that relative density of the normal pressure-sintered material is set in a range from 60 to 95% in the firing under normal pressure. Since the particles are bound together in this process, heat can be easily generated by supplying electric current therein and mixing of carbon can be decreased.

Moreover, relative density of the dense material can be increased to 98% or higher by the densification treatment. This makes it possible to decrease the resistivity and improve the thermoelectric characteristics.

It is also preferable that molding pressure for forming the green compact is 10 MPa or higher. By setting the pressure to 10 MPa or higher, it is made possible to increase the sustaining force of the green compact, make the green compact easier to handle when manufacturing and proceed the sintering process effectively.

DESCRIPTION OF REFERENCE NUMERALS

Figure 1:
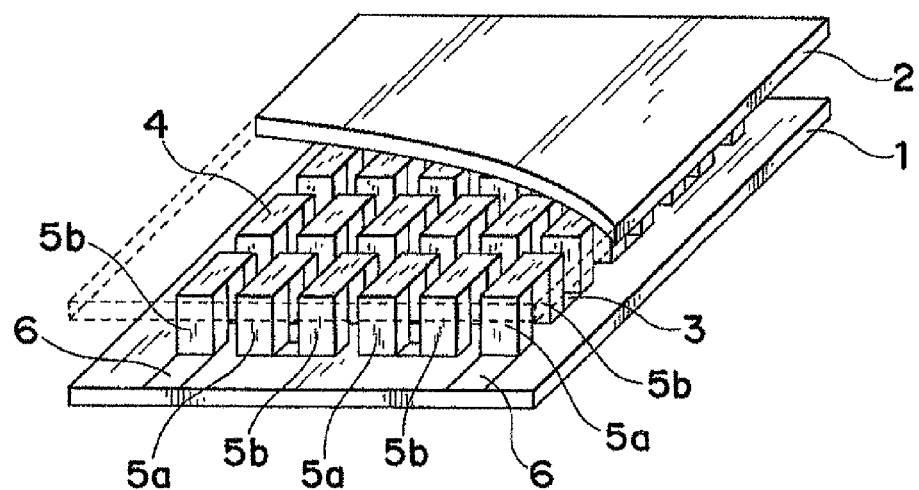
FIG. 1 is a perspective view showing the constitution of a thermoelectric module according to fourth embodiment of the present invention.
Figure 2:
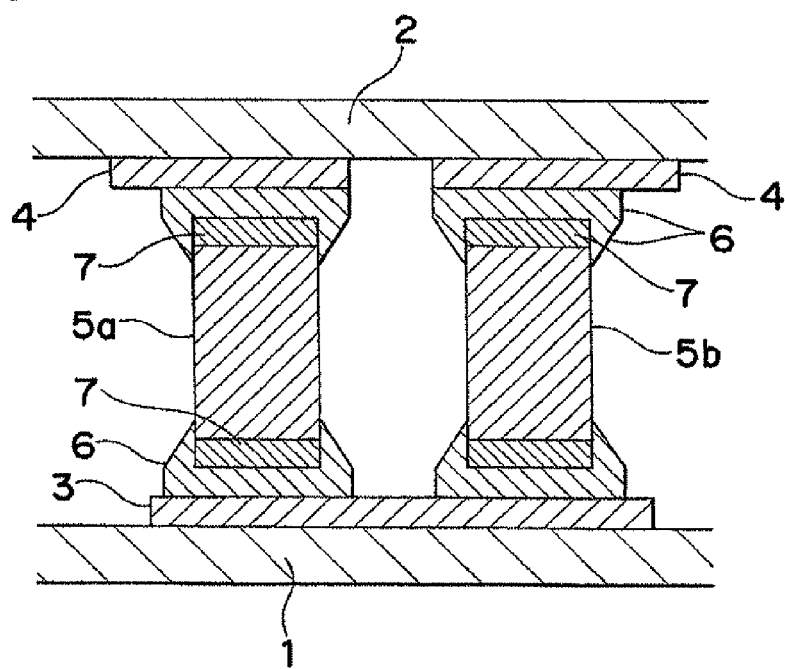
FIG. 2 is a sectional view showing an enlarged part of a section of the thermoelectric module of FIG. 1.

1, 2: Support substrate
3, 4: Wiring conductor
5: Thermoelectric element
5a: N type thermoelectric element
5b: P type thermoelectric element
6: External wiring terminals

BEST MODE FOR CARRYING OUT THE INVENTION

Now embodiments of the present invention will be described in detail.

First Embodiment

The first embodiment of the present invention relates to an N type thermoelectric material that contains bromine and iodine and a method for manufacturing the same, and a thermoelectric element obtained by processing the N type thermoelectric material.

It is important that the N type thermoelectric material of the first embodiment contains at least one kind of Bi and Sb and at least one kind of Te and Se as main components, and contains bromine (Br) and iodine (I) as dopant for adjusting the carrier concentration.

The most preferable composite known is $(Bi_2Te_3)_{0.95}(Bi_2Se_3)_{0.05}$ or $(Bi_2Te_3)_{0.50}(Sb_2Te_3)_{0.05}(Sb_2Se_5)_{0.05}$ having 0.06 to 0.09% by weight of $SbI_3$ added as a dopant.

The N type thermoelectric material of this type of composition, when at least two kinds selected from among Bi, Sb, Te and Se are contained as main components, makes a thermoelectric material that has high value of figure of merit near the room temperature. Adding Br and I together as the dopants for adjusting the carrier concentration for the purpose of making N type thermoelectric material results in the N type thermoelectric material having higher figure of merit than in the case where only one of Br and I is contained. As a result, a thermoelectric module of higher cooling performance and higher efficiency can be made by using the N type thermoelectric material of the first embodiment. According to the first embodiment, what is required is merely that both Br and I are contained as the dopants for adjusting the carrier concentration, and halogen elements other Br and I or Ag and/or Cu may or may not be contained, while content of additive elements other than Br and I is preferably one half of the total content of Br and I or less in terms of the number of atoms.

The figure of merit (Z) is an index that indicates the performance and efficiency that the thermoelectric material shows when used as the thermoelectric element, and is defined as $Z=S^2/\rho k$ where S is Seebeck coefficient, $\rho$ is resistivity and k is thermal conductivity. Higher the value of figure of merit of a material, the higher the cooling performance and efficiency of the thermoelectric module that uses the material become.

Adding Br and I together makes it possible to decrease the specific resistance of the N type thermoelectric material of the first embodiment without changing the Seebeck coefficient and specific resistance, thereby improving figure of merit. While the mechanism that decreases the specific resistance has not yet made clear, it is supposed as follows. Since Br and I have different temperatures of forming solid solution at the Te/Se site and difference distributions of solid solution, the thermoelectric material that contains the two kinds of dopant has more uniform electron density than in a case where only one of the two kinds of dopant is contained. As a result, since it is less probable that a gap arises in the electron mobility due to uneven electron density, specific resistance is not increased by the gap thus making it possible to decrease the specific resistance.

According to the first embodiment, ratio of the numbers of atoms of Br to I (Br/I) that are added as the dopants for adjusting the carrier concentration is preferably in a range from 1 to 100 inclusive. The ratio is preferably 1 or higher because Br is substituted at a lower temperature than I is, and is more likely to be dispersed uniformly than I. When the ratio of the numbers of atoms of Br to I is less than 1, electron density becomes uneven due to the existence of I. When this ratio is larger than 100, substitution with only Br occurs at a low temperature, resulting in less synergy effect of Br and I. Thus the Br/I ratio lower than 1 or higher than 100 leads to less effect of decreasing the specific resistance and significant improvement in the figure of merit cannot be anticipated in comparison to a case of adding either Br or I.

Dose of the dopant is preferably such that total number of atoms of Br and I in the alloy is not larger than $10^{20}$ cm$^{-3}$. In case $SbI_3$ and $SbBr_3$ are used, content of the dopant is preferably in a range from 0.05% to 0.5% by weight.

According to the first embodiment, the thermoelectric element having particularly high figure of merit can be obtained by using the N type thermoelectric material made from uniaxially oriented crystal and forming the thermoelectric element so that the direction of electron mobility agrees with the uniaxial orientation of the crystal. The uniaxial orientation of the crystal enables it to achieve a low specific resistance and higher effect of containing both Br and I, thereby greatly improving the figure of merit. The thermoelectric material of uniaxially oriented crystal is preferably made by directional solidification process where an alloy that has been once melted is solidified in one direction by a known technology such as Bridgman method, pulling method or zone melt method. A flake-shaped powder made by crushing an alloy that has been melted and cooled down and classified may also be heated under a uniaxial pressure by hot press or the like thereby to make a sintered material having increased degree of preferred orientation of the powder. The degree of preferred orientation in the c plane is preferably 70% or higher as determined by X ray diffraction, in order to improve the figure of merit. When this figure is less than 70%, the effect of decreasing the specific resistance becomes insufficient and the satisfactory improvement in the figure of merit cannot be achieved.

The thermoelectric element is an element formed from the thermoelectric material in a rectangular parallelepiped shape with electrodes formed by plating or the like on both ends thereof. It is usually made by forming Ni coating on both sides of a thin wafer, that is obtained by slicing a block of the thermoelectric material, and cutting the wafer into chips. When a thermoelectric module is made by using the thermoelectric element made by this method, electric current is supplied through the electrodes provided on both sides.

According to the first embodiment, the thermoelectric element having high figure of merit is obtained by making the direction of flowing electrical current, namely the direction of electron mobility, coincide with the direction of crystal orientation. In $A_2B_3$ type crystal (A represents Bi and/or Sb, and B represents Te and/or Se), specific resistance along the direction of c plane (direction parallel to the c plane) is one order of magnitude smaller than that in the a and b planes. Therefore, electric current can be flown in a direction of lower specific resistance by making the direction of electron mobility coincide with the direction of crystal orientation, thus improving the figure of merit of the thermoelectric element.

Now the method of manufacturing the N type thermoelectric material of the first embodiment will be described.

Bi, Sb, Te and Se metals, $SbBr_3$ or $HgBr_3$ as a Br dopant and $SbI_3$ as an I dopant are prepared. These stock material powders are weighed and sealed within a quartz tube in an inert gas or vacuum atmosphere. The powder is then heated to melt and is cooled so as to obtain melt-refined alloy. The method of manufacturing the N type thermoelectric material according to the first embodiment includes a process of adding at least one of antimony tribromide ($SbBr_3$) and mercury dibromide ($HgBr_2$), and antimony triiodide ($SbI_3$) at the same time as the dopants for adjusting the carrier concentration. Use of such compounds enables it to make the material that contains both Br and I with good reproducibility while suppressing dopant from evaporating and the figure of merit from varying.

In the method of manufacturing the N type thermoelectric material of the first embodiment, it is preferable to control the contents of $SbBr_3$ or $HgBr_2$ and $SbI_3$ together as the materials to supply the dopants so that the ratio of the numbers of atoms of Br to I falls in a range from 1 to 100 inclusive. The N type thermoelectric material having high figure of merit can be made by adding the dopant in such a concentration so as to achieve uniform electron density.

Then the melt-refined alloy is subjected to hot press or discharge plasma sintering process to make a sintered material or to Bridgman process or zone-melt process to make a directionally solidified material. According to the first embodiment, the thermoelectric material made in this way is preferably made of uniaxially oriented crystal. The reason for the uniaxially oriented crystal to be preferred has been described previously. The thermoelectric material of uniaxial orientation may be made by crushing a melt-refined alloy, classifying the crushed material by sieving to make a powder of uniform particle size and sintering the powder while applying a pressure in one direction by hot press or the like. Another preferable method is to melt the melt-refined alloy again and directionally solidifying it. With this method, uniaxially oriented crystal can be reliably made. With either of these methods, it is preferable that the degree of preferred orientation in c plane is 70% or higher in order to improve the figure of merit. The degree of preferred orientation in c plane can be determined from the peak intensity (I) of the plane of orientation measured by X ray analysis of the plane of c plane orientation. In the first embodiment, the degree of preferred orientation in c plane refers to the ratio of the sum of intensities I (006) and I (0015) to the sum of intensity I (015) of the main peak of $A_2B_3$ type crystal, intensity I (006) that represents the c plane and intensity I (0015) that are obtained from the X ray diffraction analysis, as shown below.

Degree of preferred orientation $f(\%)=(I(006)+I(0015))/(I(006)+I(015)+I(0015))$ While the directionally solidified thermoelectric crystalline material can be manufactured by a known method of the prior art, such a method as described below can be employed with a lower cost.

First, melt-refined alloy is crushed to prepare alloy powder. A mold having an internal space for growing crystal is prepared. While the mold may be formed from any material as long as the material is stable enough to not react with the alloy at high temperatures when the alloy powder is melted therein, it is preferable to use a mold made of carbon for the reason of cost, high durability and good machinability.

The mold is put into a crucible made of carbon or quartz glass. For example, the alloy powder is put on top of the mold that is put into the crucible made of carbon in the shape of test tube and is heated to melt. The molten alloy then infiltrates the inner space of the mold. The atmosphere in a furnace in which this process is carried out is preferably an inert gas atmosphere such as Ar, and it is more preferable that the mouth of the crucible is made small so as to suppress elements that have high vapor pressure such as Te and Se from evaporating.

After the infiltration, part of the molten alloy is cooled and solidified by a method of moving the mold similarly to Bridgman method or pulling method of pulling up the crystal from the mold, thereby to obtain the crystal that has been directionally solidified. While the melting temperature depends on the composition, the alloy powder is melted at a temperature 100 to 200° C. higher than the melting point. The speed of moving the mold or the crystal is preferably in a range from 1 to 10 mm/h in order to improve the figure of merit.

The N type thermoelectric material having high figure of merit Z that has been made as described above is combined with the P type thermoelectric material of the prior art, so as to make the thermoelectric module. This thermoelectric module shows cooling performance and efficiency that are far higher than those of the thermoelectric module of the prior art.

Thus it is expected that the thermoelectric module of the present invention can be applied to refrigerator and air conditioner for home use that require high cooling capability.

Second Embodiment

Now a second embodiment of the present invention will be described in detail.

The second embodiment relates to a directionally solidified thermoelectric crystalline material that contains a boron compound and a method for manufacturing the same, a thermoelectric element obtained by processing the thermoelectric crystalline material and thermoelectric module.

It is important that the directionally solidified thermoelectric crystalline material of the second embodiment is a thermoelectric crystalline material constituted from uniaxially oriented crystal that contains at least two elements selected from among Bi, Sb, Te and Se as main components, and contains a boron (B) compound.

The composition of the directionally solidified thermoelectric crystalline material can be made such that has high figure of merit at room temperature, by using at least two elements selected from among Bi, Sb, Te and Se as the main components. In addition, the figure of merit is improved to $3\times10^{-3}$/K or higher by containing the boron compound, so as to make the thermoelectric crystalline material that can be preferably used to make the thermoelectric module that has high cooling capability and high cooling efficiency.

According to the second embodiment, decreases in Seebeck coefficient and in specific resistance can be made smaller by containing the boron compound, and thermal conductivity can be decreased, thereby improving the figure of merit. The mechanism that causes thermal conductivity to decrease as the boron compound is contained is supposedly that phonon is scattered by the boron compound located in the grain boundary, among the boron compound contained in the crystal, so that mean free path of phonon is decreased and thermal conductivity becomes lower.

While a non-metal compound such as BN, $B_4C$ or $B_2O_3$ that exists stably at room temperature or a boride of a metal such as $TiB_2$, $ZrB_2$, or $HfB_2$ may be used as the boron compound, it is preferable to use a non-metal compound in consideration of the influence on Seebeck coefficient and specific resistance.

In the directionally solidified thermoelectric crystalline material based on Bi, Sb, Te and/or Se, particles of the secondary phase are less likely to remain because of the crystal structure that is proximate to single crystal. According to the second embodiment, however, since boron has a small atomic radius and the boron compound has high heat resistance and low reactivity with Bi and Te, it tends to remain in the molten alloy in which Bi, Sb, Te and/or Se are mixed and be taken in as an inclusion, so as to remain as the secondary phase. While the location where the boron compound remains may be either inside of grains, grain boundary or cleavage surface, it is preferable that the boron compound remains in the cleavage surface since it leads to less influence on Seebeck coefficient and specific resistance.

It is preferable that the boron compound contains at least one of boron nitride (BN), boron carbide ($B_4C$) and boron oxide ($B_2O_3$).

These boron compounds are particularly stable at high temperatures. In other words, these boron compounds have low tendency to react with Bi, Sb, Te and Se, and as being non-metallic material, they have less influence on Seebeck coefficient and specific resistance, so that the figure of merit can be improved further.

According to the second embodiment, content of the boron compounds is preferably in a range from 0.01 to 0.5% by weight in terms of boron element.

When the content is less than 0.01% by weight, the effect of decreasing the thermal conductivity becomes insufficient, thus resulting in no improvement in the figure of merit. When the content is more than 0.5% by weight, on the other hand, Seebeck coefficient and specific resistance rapidly changes unfavorably, thus resulting in lower figure of merit. The content is more preferably in a range from 0.01 to 0.3% by weight, and most preferably in a range from 0.01 to 0.1% by weight.

Mean particle size of the boron compound is preferably in a range from 0.01 to 0.1 µm, which allows the boron compound to be dispersed uniformly in the directionally solidified thermoelectric crystalline material, thus achieving a remarkable effect of decreasing the thermal conductivity.

Now the method of manufacturing the directionally solidified thermoelectric crystalline material will be described.

First, a mixed powder of Bi, Sb, Te and Se metals and dopant consisting of halide such as $SbI_3$ or $HgBr_2$ mixed in predetermined proportions is prepared. These stock material powders are weighed and sealed within a quartz tube in inert gas atmosphere or in vacuum, then heated to melt and is cooled so as to obtain melt-refined alloy.

The melt-refined alloy is then crushed coarsely in a stamp mill, ball mill or mortar, thereby to make the alloy powder. While there is no restriction on the particle size after crushing, it is preferable to crush to achieve particle size not larger than 5 mm in order to uniformly melt before being subject to directional solidification.

Then the boron compound to be added is prepared. It is important that the boron compound is supplied in the form of powder or slurry. In case the boron compound is added in the form of powder or slurry of the powder dispersed in water or an organic solvent, it becomes easier to mix with the alloy powder and can be dispersed uniformly without using a special apparatus.

When adding the boron compound, it is important to add the boron compound to the alloy powder that has been prepared in advance. When it is added to the melt-refined alloy, the boron compound is separated from the alloy in the stage of making the molten material and cannot be dispersed uniformly. Therefore, it is important to mix the boron compound with the alloy powder obtained by crushing the melt-refined alloy. While there is no restriction on the method of adding the boron compound, the alloy powder and the boron compound may be mixed in a polyethylene bottle. When slurry has been added, solvent of the slurry is vaporized to obtain boron-containing an alloy powder. The slurry may be sprayed.

Total amount of the boron compounds is preferably in a range from 0.01 to 0.5% by weight in terms of boron element. In the case of adding in the form of powder, the powder is weighed with a balance. In the case of adding in the form of slurry, it is necessary to weigh the slurry by giving consideration to the content of boron in advance.

In case one of boron nitride (BN), boron carbide ($B_4C$) and boron oxide ($B_2O_3$) is used, it would not be dissolved when dispersed in water or an organic solvent nor evaporate when dried. Therefore, the quantity to be added can be easily calculated from stoichiometrical composition representing the proportions of atoms of the compounds. In case a boron compound other than the three kinds described above is added, it is preferable to control the content of boron compound by measuring the boron compound in terms of boron element after the slurry is dried by chemical analysis (IPC emission spectrochemical analysis).

Now a method of making the directionally solidified thermoelectric crystalline material from the boron-containing alloy powder will be described. While crystal growth by directional solidification process may be carried out by a known technology such as Bridgman method, pulling method or zone melt method, a method that employs a low-cost apparatus and is applicable to mass production will be described here.

First, a mold that has an inner space for growing the crystal is prepared. While the mold may be formed from any material as long as the material is stable enough to not react with the alloy at high temperatures when the alloy powder is melted therein, it is preferable to use a mold made of carbon for the reason of cost, high durability and good machinability.

The cavity of the mold is preferably formed in the shape of rectangular parallelepiped or cylinder measuring 10 $mm^2$ or less in cross sectional area and 50 mm or more in length. This is for the purpose of causing the boron compound that has been added to be dispersed uniformly in the directionally solidified crystal and stabilize the figure of merit. When the cross sectional area is larger than 10 $mm^2$, solidification tends to be uneven within a plane perpendicular to the direction of solidification due to uneven temperature distribution, which leads to uneven dispersion of the boron compound within the plane thus resulting in uneven decrease in the thermal conductivity that makes the value of figure of merit unstable. Variability of the figure of merit becomes smaller with smaller cross sectional area, which is more preferably 5 $mm^2$ or less and most preferably 2 $mm^2$ or less. With regard to the length, too, a crystal shorter than 50 mm is unfavorable for mass production of the thermoelectric element and therefore longer crystal is preferable. The length is more preferably 100 mm or more and most preferably 120 mm or more.

Then the mold is put into a crucible made of carbon or quartz glass. For example, the alloy powder is put into the cavity of the mold that is put into the crucible made of carbon in the shape of test tube and is heated to melt. The molten alloy then infiltrates the inner space of the mold. The atmosphere in a furnace in which this process is carried out is preferably an inert gas atmosphere such as Ar, and it is more preferable that the mouth of the crucible is made small so as to suppress elements that have high vapor pressure such as Te and Be from evaporating.

After the infiltration, part of the molten alloy is cooled and solidified by a method of moving the mold similarly to Bridgman method or pulling method of pulling up the crystal from the mold, thereby to obtain the crystal that has been directionally solidified. While the melting temperature depends on the composition, the alloy powder is melted at a temperature 100 to 200° C. higher than the melting point. The speed of moving the mold or the crystal is preferably in a range from 1 to 10 mm/h in order to improve the figure of merit.

The thermoelectric crystalline material made as described above can be preferably used as the thermoelectric element.

Third Embodiment

It is important that the thermoelectric material according to the third embodiment of the present invention is a dense material that contains at least two elements selected from among a group consisting of Bi, Sb, Te and Se. Such a material has a higher value of figure of merit, and is preferably $A_2B_3$ type intermetallic compound, for example a semiconductor crystal where A is substituted by Bi and/or Sb and B is substituted by Te and/or Se, and the ratio B/A is in a range from 1.4 to 1.6, which is preferable for improving the figure of merit at the room temperature.

As the $A_2B_3$ type intermetallic compound, at least one kind of $Bi_2Te_3$, $Sb_2Te_3$ and $Bi_2Se_3$, $Bi_2Te_{3-x}Se_x$, (x is from 0.05 to 0.25) that is a solid solution of $Bi_2Te_3$ and $Bi_2Se_3$, or $Bi_xSb_{2-x}Te_3$, (x is from 0.1 to 0.6) that is a solid solution of $Bi_2Te_3$ and $Sb_2Te_3$ may be used.

An impurity may be added as a dopant to the intermetallic compound so as to turn it efficiently into a semiconductor. For example, an N-type semiconductor can be made, by adding a compound that contains a halogen element such as I, Cl or Br to the stock material powder. For example, adding AgI powder, CuBr powder, $SbI_3$ powder, $SbCl_3$ powder, $SbBr_3$ powder, $HgBr_2$ powder or the like enables it to control the carrier concentration in the intermetallic compound semiconductor, thereby to improve the figure of merit. The halogen element is preferably added in a concentration in a range from 0.01 to 5% by weight, particularly from 0.05 to 4% by weight in order to efficiently make semiconductor.

In order to make a P type semiconductor, Te may be contained for controlling the carrier concentration, thereby improving the figure of merit similarly to the case of the N type semiconductor.

According to the present invention, the dense material having such a composition as described above is preferable to improve the thermoelectric performance and make a cooling device.

Mean particle size of the dense material that constitutes the thermoelectric material of the present invention is required to be not larger than 30 μm. Strength can be made higher by making the particle size smaller and, when the material is used as the thermoelectric element of the thermoelectric module, it has an effect of improving the reliability of the thermoelectric module. Smaller particle size also results in lower thermal conductivity and higher figure of merit of the thermoelectric material. In order to enhance these effects further, the mean particle size of the dense material is preferably 15 μm or less, more preferably 10 μm or less and most preferably 8 μm or less.

While there is no restriction on the lower limit of the mean particle size of the dense material, too small a particle size requires it to prepare fine stock material powder which poses the danger of explosion and is difficult to handle. From these considerations, the mean particle size is preferably 1 μm or more, more preferably 3 μm or more and most preferably 5 μm or more.

It is important that carbon concentration in the thermoelectric material of the present invention is 0.3% by weight or less. Since carbon has electrical conductivity, mixing the carbon particles in a semiconductor generates electric charge around the particles, resulting in scattering of the carrier. Therefore, it is important to control the carbon content in the dense material to 0.3% by weight or less in order to improve the thermoelectric performance.

Particularly to obtain a thermoelectric material having high figure of merit of $3\times10^{-3}$/K or higher, carbon content in the dense material is preferably 0.25% by weight or less, more preferably 0.2% by weight or less.

Since oxygen has an effect of forming an insulation layer and increases the specific resistance, it is important to control the oxygen content to 0.3% by weight or less in order to improve the figure of merit. Particularly to obtain a thermoelectric material having high figure of merit of $3\times10^{-3}$/K or higher, oxygen content is preferably 0.25% by weight or less, more preferably 0.2% by weight or less.

Carbon content and oxygen content are preferably as low as possible, and the lower limits for the carbon content and oxygen content are preferably 0.01% by weight or less, more preferably 0.001% by weight or less. However, it is not easy to make a dense material that contains low contents of carbon and oxygen, which also increases the manufacturing cost. Therefore, the content may be set to around 0.1% by weight that makes it relatively easy to control the content and enables it to suppress the thermoelectric characteristic from degrading. This makes it possible to make the thermoelectric material of high figure of merit at a lower cost.

Relative density of the dense material of the third embodiment is 98% or higher, preferably 98.5% or higher, and more preferably 99% or higher. Such a high relative density leads to favorable electric property, namely lower resistivity and, as a result, has an effect of improving the performance of the thermoelectric element further.

The thermoelectric material of the third embodiment can be made by a sintering process as described below. The thermoelectric material made by the following process has a high value of figure of merit, and therefore the thermoelectric module made from the thermoelectric material has high cooling capability and is suitable for use in cooling and heating applications.

The thermoelectric material of the third embodiment can be used in a thermoelectric module that is constituted from a combination of P type and N type thermoelectric elements, as the thermoelectric element of at least one conductivity type. The thermoelectric material of the third embodiment may be used in either one or both of the P type thermoelectric element and N type thermoelectric element.

Now the method of manufacturing the thermoelectric material of the present invention will be described.

First, the stock material powder of the thermoelectric material is prepared. The stock material powder may be prepared by making an ingot that contains at least two elements selected from among Bi, Sb, Te and Se by melt-refining method, and classifying a commercially available powder of large particle size. Alternatively, the powder used in the present invention can be made easily by conditioning commercially available powder that has non-uniform particle sizes and is relatively low in cost into desired composition, adding an organic solvent and crushing it.

While the stock material powder can be crushed by means of a vibration mill, barrel mill, rotary ball mill or the like, it is preferable to use balls made of silicon nitride in crushing. Container used in the crushing operation may be a resin pot made of polyethylene or the like or a ceramic pot lined with a resin on the inside thereof. By using such a container and balls made of silicon nitride, it is made possible to suppress the impurity that mixes in during the crushing operation to 500 ppm or less, particularly 100 ppm or less and further 50 ppm or less. Thus excellent thermoelectric characteristics can be easily achieved by preventing the characteristics from deteriorating due to the impurity.

The organic solvent used in the crushing operation may be at least one kind selected from among methanol, ethanol, isopropanol, butanol and hexane. Among these, isopropanol is preferably used for the reason of the efficiency of crushing and the cost.

It is important to control the mean particle size of the stock material powder obtained by crushing to not larger than 30 μm. Use of such a stock material powder enables it to obtain the dense material having mean particle size of 30 μm or less through the sintering process and the densification treatment. In order to improve the property to sinter by firing under normal pressure, mean particle size of the stock material powder is 15 μm or less, preferably 10 μm or less and more preferably 8 μm or less.

According to the manufacturing method of the third embodiment, it is important to make the green compact by molding the stock material powder described above. By making the green compact in advance prior to firing, it becomes easier to handle during the manufacturing process because of the integrity of the configuration while making it possible to prevent oxygen from mixing in before firing, thus reducing the possibility of producing defective parts.

Pressure applied for molding is preferably 10 MP or higher, more preferably 20 MP or higher and most preferably 30 MP or higher. This increases the shape holding force of the green compact so as to make it easier to handle during manufacturing, and increases the green density, so that sintering process can proceed effectively.

According to the third embodiment, it is preferable to mold the green compact such that the relative density falls in a range from 50 to 90%. Lower limit of the theoretical density of the green compact is 50%, preferably 60% and more preferably 70% in order to maintain the shape during handling. Upper limit of the theoretical density of the green compact is 90%, preferably 85% and more preferably 80% in order to remove oxygen efficiently when firing under normal pressure.

While various molding methods may be employed for molding such as press molding, extrusion molding, casting, tape molding or cold isostatic pressing (CIP) that are known technologies, press molding or CIP is preferable for the capability to adapt to mass production and to maintain the theoretical density constant.

According to the third embodiment, it is important to fire the green compact under the normal pressure. By firing the green compact under the normal pressure so as to sinter before putting it into the carbon mold, it is made possible to prevent carbon and oxygen from mixing into the sintered material during the densification treatment.

It is preferable that the normal pressure-sintered material obtained by firing under normal pressure has mean particle size of 30 μm or less with carbon content and oxygen content being 0.3% by weight or lower. It is important to make the relative density of the normal pressure-sintered material 60% or higher, preferably 70% or higher and more preferably 80% or higher, in order to prevent carbon and oxygen from mixing into the green compact while being sintered by supplying pulsed electric current. While the upper limit of the theoretical density depends on the theoretical density of the green compact and temperature of firing under normal pressure, the upper limit is set to 95% since sufficient density cannot be achieved by firing under normal pressure. The upper limit is preferably in a range from 80 to 90% in order to manufacture the thermoelectric material having excellent characteristics while preventing impurities from mixing in.

According to the third embodiment, it is important that at least the particles of the sintered material are bonded together, not in the state of the particles being individually existing in a body that has been simply formed, after being fired under normal pressure. A green compact made by simply pressurizing the stock material powder has a high void ratio, and therefore carbon and oxygen tend to mix in.

Particularly, when the particles of the sample after being fired under normal pressure remain in the state of individual powder particles, plasma discharge occurs between the particles when supplying electric current so that the effect of removing oxygen from the surface of the particle, but it becomes difficult to obtain the thermoelectric material of the present invention due to mixing of carbon during sintering process. However, in the case of a sintered material consisting of particles bound together by sintering as the normal pressure-sintered material of the third embodiment, plasma discharge does not occur and carbon can be effectively prevented from mixing in.

The atmosphere of firing under normal pressure according to the method of the third embodiment is preferably reducing atmosphere that is capable of efficiently removing oxygen that is the impurity contained in the green compact and has the effect of improving the thermoelectric characteristics. Particularly, it is preferable to use a reducing atmosphere that contains hydrogen. In this case, hydrogen concentration may be 10% or higher, but it is preferable that hydrogen concentration is 30% or higher, more preferably 50% or higher and most preferably 70% or higher, in order to remove oxygen efficiently.

While temperature of firing under normal pressure with the method of the third embodiment depends on the composition, the temperature is in a range from 300 to 550° C., preferably from 350 to 525° C., more preferably from 385 to 500° C., and most preferably from 400 to 500° C. Such a temperature range enables it to sinter by promoting the growth of the neck between the particles, to easily make the sintered material having high strength while preventing the grains from decomposing or rapidly growing and efficiently removing oxygen.

Normal pressure in the third embodiment refers to such a pressure as a low-cost core tube made of ordinary stainless steel or quartz, and is in a range from 0.05 to 0.2 MPa and preferably from 0.5 to 0.15 MPa.

It is important to apply the densification treatment to the normal pressure-sintered material that has been made as described above, thereby to make the dense material. The densification treatment may be carried out by means of at least one of direct electric current heating, hot press (HP) method, gas pressure sintering (GPS) method and hot isostatic pressure (HIP) sintering method. Among these, the direct electric current heating method makes it possible to quickly heat with high energy efficiency, while reducing the period of heat treatment and effectively preventing impurities from mixing in. It is preferable to employ the direct electric current heating method in order to make the thermoelectric material having high strength and high performance with fine structure.

Heating by direct electric current is preferably carried out by supplying pulsed electric current. Pulsed electric current makes it possible to prevent local overheating and easily carry out uniform temperature control, thereby to easily obtain the dense material that has uniform composition.

The densification treatment is preferably carried out by heating and applying a pressure at the same time. Pressurization accelerates the densification so that density can be increased easily in a shorter period of time.

There is the hot press method that resembles the densification treatment of the third embodiment. In the hot press method, however, since the stock material powder is put into a die and is heated together with the die, oxygen and/or carbon tend to diffuse from the die into the sintered material.

According to the third embodiment, in contrast, since the normal pressure-sintered material is put into the carbon die and is heated, the sintered material can be protected from oxygen mixing in and contamination with carbon diffusing from the carbon die during the densification treatment.

The densification treatment by electric heating, in particular, makes it possible to increase the density at a low temperature at which it is impossible to sinter by the hot press method, and enables it to raise the temperature at a fast rate of 100° C. per minute, thus achieving the treatment in a shorter period of time. As a result, the thermoelectric material of high performance with restricted mixing of impurity can be easily obtained through treatment at a lower temperature for a short period of time and the processing of sintered material having a high density.

There is pulsed electric current sintering (PECS) method that resembles the method of applying heat and pressure at the same time by pulse electric current. This is a sintering method that is called the discharge plasma sintering (SPS) method or plasma activation sintering (PAS) method, where a powder or a green compact is put into a jig of a low resistance such as carbon die that is held by a pinch made of carbon on the top and bottom and is heated and sintered by supplying pulsed electric current of large magnitude through the pinch.

In the PECS method where the stock material powder is sintered by directly supplying pulsed electric current, since the particles merely make contact with each other without binding, supplying pulsed electric current to the powder or green compact causes plasma discharge in the early stage of sintering thus making it probable that carbon from the carbon die that holds the stock material powder mixes into the sintered material.

According to the method of this embodiment, in contrast, discharge plasma is not generated since electric current is directly supplied either continuously or in pulses. In addition, electric current flows directly in the sintered material that is efficiently heated by Joule heat, growth of the particles is restricted by the densification treatment that is carried out in a short period of time by the direct heating by electric current, and mixing of impurities such as carbon and oxygen can be suppressed. As a result, according to the present invention, it is made possible not only obtain the dense material that cannot be obtained by firing under normal pressure showing excellent thermoelectric characteristics, but also to improve the mechanical properties due to the fine structure and improve the productivity through the shorter duration of the treatment. Moreover, when pulsed electric current is used, it becomes easier to control the temperature and variation in the composition due to local overheat can be effectively prevented.

In the densification treatment of the third embodiment, it is preferable that the normal pressure-sintered material is heated to 200° C. or higher for a period of one hour or less, particularly for 45 minutes or less and more particularly for 30 minutes or less. The heating procedure may be such as heating up to 500° C. in 10 minutes, holding this temperature for 10 minutes and cooling in 5 minutes. The atmosphere of sintering by pulsed electric current may be either inert gas atmosphere or vacuum, although argon gas atmosphere is preferable for the reason of low cost and prevention of denaturing.

The processing temperature of the densification treatment is preferably not higher than the temperature of the firing under normal pressure. This makes it possible to suppress the grain growth by setting the densification temperature lower than the firing temperature, thereby to easily achieve high strength.

By applying the densification treatment of the present invention to the normal pressure-sintered material, the dense material having relative density of 98% or higher, particularly 98.5% and more particularly 99% or higher can be obtained. By increasing the relative density in this way, the thermoelectric material having excellent thermoelectric performance can be obtained.

This method of manufacturing the thermoelectric material enables it to achieve the thermoelectric material of fine structure that has high strength and high performance, while suppressing carbon and oxygen from mixing in.

Fourth Embodiment

The thermoelectric element of the fourth embodiment of the present invention is constituted from the thermoelectric material of the first through third embodiments.

The thermoelectric element of the fourth embodiment is manufactured by processing a long body made of the thermoelectric material of the first through third embodiments.

A body of directionally solidified thermoelectric crystalline material having rectangular cross section of area 10 mm$^2$ or less and 50 mm or more in length will be taken as an example in the description that follows.

The long body of directionally solidified thermoelectric crystalline material is covered with a resin that is resistant to plating, namely a plating resist, on the side face thereof. While thickness of the plating resist may be several micrometers that is enough to achieve the effect, the thickness is preferably 20 μm or larger, and more preferably 50 μm or larger in order to prevent it from peeling off after the subsequent operation of cutting off and improve the reliability of the resist to hold on.

The plating resist may be any material as long as it is durable against the electroless nickel plating or gold plating (or vapor deposition of gold) that is commonly employed for the thermoelectric element. In case plating is applied in the subsequent process, the plating resist is preferably an organic material that is resistant against acid since acid treatment is applied as a preliminary treatment. Acrylic resin is particularly preferably used as the plating resist, since it has resistance against plating and can be easily removed by means of an alkaline solution after the plating.

While the plating resist may be applied by printing or vapor deposition in vacuum, it is preferably applied by dipping the material in a solution of the resist diluted with an organic solvent, taking out of it to dry and dipping in the solution, while repeating this process several times, since this can be favorably applied to mass production at a low cost.

The plating resist may also be coated with a material from which the plating can be removed easily. This enables it to remove the plating resist more easily.

Then a plurality of thermoelectric crystal members coated with the plating resist are arranged side by side and are cut off in a direction substantially perpendicular to the longitudinal direction with thin blade of a wire saw or dicing saw rotating at a high speed. The cut-off surface is coated with a plating layer to be described later. Dimensional accuracy of the thermoelectric element can be improved by cutting the long body. Variability in the cooling performance, particularly in the resistance when used in the thermoelectric module can be decreased.

The thermoelectric crystal member thus obtained is plated. The plating layer is required to be capable of preventing the thermoelectric element from reacting with copper that is used as the material to form electrodes of the thermoelectric module, and have the property to be well wetted by solder so as to be easily bonded. Based on these considerations, it is preferable to apply nickel plating and then apply gold plating thereon.

Then in order to cause the plating layer formed over all surfaces, to remain only on the cut-off surface, the plating resist is removed by means of an alkaline solution or other plating resist removing material. Thus the plating resist and the plating layer formed thereon are removed, and the thermoelectric element having the plating layer only on the cut-off surface can be made.

The thermoelectric element thus obtained is preferably used for the thermoelectric module.

The thermoelectric module comprises a support substrate 1 whereon wiring conductor 3 is formed, a support substrate 2 whereon wiring conductor 4 is formed and a plurality of thermoelectric elements that have been made as described above.

The plurality of thermoelectric elements are constituted from a plurality of N type thermoelectric elements 5a having negative value of Seebeck coefficient and a plurality of P type thermoelectric elements 5b having positive value of Seebeck coefficient made as described above.

The plurality of N type thermoelectric elements 5a and the plurality of P type thermoelectric elements 5b made as described above are disposed between the support substrates 1 and 2 so that the N type thermoelectric elements 5a and the P type thermoelectric elements 5b are connected in series with the wiring conductors 3, 4 as shown in FIG. 1. The plating electrodes of the thermoelectric elements 5 and the wiring conductors 3, 4 are joined by, for example, solder. The wiring conductors 3, 4 connected to the thermoelectric element 5 are connected to the external connection terminals 6. Connected to the external connection terminals 6 by soldering are external wirings, so as to supply electric power from the outside.

The thermoelectric module having far better cooling capability and efficiency than the thermoelectric module of the prior art can be manufactured at a low cost by using the thermoelectric material of the first through third embodiments having a high figure of merit as described above. Thus the thermoelectric module of the present invention can be applied to refrigerator and air conditioner for home use that require high cooling capability.

EXAMPLES

Now Examples of the present invention will be described.

Example 1

Example 1 is an example related to the first embodiment.

In Example 1, metal powders of Bi, Te, Sb and Se having purity of 99.99% or higher as the stock material and $SbBr_3$, $HgBr_2$, $SbI_3$, CuBr, $HgCl_2$, and AgI as dopant for adjusting the carrier concentration were prepared. Then a matrix alloy for the N type thermoelectric material was made. The metal powders were weighed and mixed so as to achieve the composition of $(Bi_2Te_3)_{0.90}(Sb_2Te_3)_{0.05}(Sb_2Se_3)_{0.05}$ of the matrix alloy. The mixed powder was put into a crucible made of carbon that was then closed with a lid. The crucible was put into a quartz tube which was pumped vacuum, and was heated at 800° C. in argon atmosphere for 5 hours, thereby to make melt-refined matrix alloy.

The melt-refined matrix alloy was crushed in a glove box to obtain the powder of matrix alloy. Dopant agents of the kinds and quantities shown in Table 1 were added to the matrix alloy powder so that halogen elements acting as the dopant, Cu and Ag in total amount of 0.1 mol % were added to the matrix alloy powder. The mixed powder was again put into the quartz tube which was pumped vacuum, and was heated at 800° C. in argon atmosphere for 5 hours, thereby to make melt-refined matrix alloy. The melt-refined alloy was crushed by a stamp mill in the glove box, and was classified with a sieve of 2 mm mesh thereby to make melt-refined alloy powder.

The mixed alloy powder was processed by the hot press method or Bridgman method to make directionally solidified material. In the hot press method, the powder was put into a carbon mold measuring ϕ30-t5, and was sintered at a temperature of 500° C. under a pressure of 49 MPa for 1 hour. A sample for comparison was also made by sintering under a pressure of 1 MPa. The sintered material thus obtained was cut into rectangular parallelepiped measuring 3 mm in width and thickness and 20 mm in length so that longitudinal direction is perpendicular to the direction in which the pressure was applied by the hot press.

In the Bridgman method, the powder was put on top of the square mold made of carbon having a space of cylindrical shape measuring 2 mm² or less in cross sectional area and 100 mm or more, and was melted at a temperature of 800° C. in a single crystal growing apparatus having a vertical quartz tube used as the core tube so as to fill the space the molten metal. Then the mold was cooled down while moving according to the Bridgman method, thereby to grow the crystal at a rate of 2 mm/h at a temperature near the freezing point (600° C.). In the Bridgman method, a long body of N-type directionally solidified thermoelectric crystalline material having cross sectional area of 2 mm² was made and cut to length of 20 mm.

Seebeck coefficient (S) and specific resistance ($\rho$) in the longitudinal direction of these rectangular parallelepiped blocks were measured with a commercially available Seebeck coefficient measuring apparatus (ZEM apparatus manufactured by Shinku Riko Co., Ltd.). Both blocks were cut to thickness of 1 mm, of which thermal conductivity ($\kappa$) was measured by laser flash method and the figure of merit Z was calculated from the equation $Z=S^2/\rho\kappa$. The samples used in the measurement were used to determine the concentrations of Br and I in the material by ICP emission spectrochemical analysis. Peak intensities I(006), I(015) and I(0015) were determined through X ray diffraction analysis of the plane in the longitudinal direction. From the proportions of I(006) and I(0015) to the sum of these intensities, the degree of preferred orientation in C plane was calculated by the equation f(%)= (I(006)+I(0015))/(I(006)+I(015)+I(0015)). The results are shown in Table 1.

TABLE 1-1

| | Dopant added | | | | | Method |
|---|---|---|---|---|---|---|
| | Dopant 1 | | Dopant 2 | | Dopant 3 | | of pre- |
| No. | Composition | wt % | Composition | wt % | Composition | wt % | paring material |
| *1 | SbBr₃ | 0.14 | SbI₃ | 0 | | | BM |
| 2 | SbBr₃ | 0.14 | SbI₃ | 0.001 | | | BM |

TABLE 1-1-continued

| | Dopant added | | | | | | Method |
|---|---|---|---|---|---|---|---|
| | Dopant 1 | | Dopant 2 | | Dopant 3 | | of pre- |
| No. | Composition | wt % | Composition | wt % | Composition | wt % | paring material |
| 3 | SbBr$_3$ | 0.14 | SbI$_3$ | 0.002 | | | BM |
| 4 | SbBr$_3$ | 0.14 | SbI$_3$ | 0.01 | | | BM |
| 5 | SbBr$_3$ | 0.12 | SbI$_3$ | 0.05 | | | BM |
| 6 | SbBr$_3$ | 0.07 | SbI$_3$ | 0.07 | | | BM |
| 7 | SbBr$_3$ | 0.06 | SbI$_3$ | 0.09 | | | BM |
| *8 | SbBr$_3$ | 0 | SbI$_3$ | 0.12 | | | BM |
| 9 | HgBr$_2$ | 0.14 | SbI$_3$ | 0.03 | | | BM |
| 10 | HgBr$_2$ | 0.06 | SbBr$_3$ | 0.08 | SbI$_3$ | 0.05 | BM |
| 11 | HgBr$_2$ | 0.06 | SbBr$_3$ | 0.08 | AgI | 0.05 | BM |
| *12 | AgI | 0.12 | | | | | BM |
| *13 | CuBr | 0.12 | | | | | BM |
| *14 | HgCl$_2$ | 0.13 | | | | | BM |
| *15 | SbBr$_3$ | 0.12 | | | | | HPH |
| 16 | SbBr$_3$ | 0.1 | SbI$_3$ | 0.05 | | | HPH |
| 17 | HgBr$_2$ | 0.14 | SbI$_3$ | 0.03 | | | HPH |
| 18 | HgBr$_2$ | 0.14 | SbI$_3$ | 0.03 | | | HPL |

The symbol * indicates example out of the scope of the present invention.
BM: Bridgman method
HPH: Hot press method (pressure 49 MPa)
HPL: Hot press method (pressure 1 MPa)

TABLE 1-2

| | Thermoelectric performance | | | |
|---|---|---|---|---|
| No. | S μV/K | ρ mΩcm | κ W/mK | Z 10$^{-3}$/K |
| *1 | −233 | 1.33 | 1.45 | 2.82 |
| 2 | −232 | 1.22 | 1.47 | 3.00 |
| 3 | −229 | 1.19 | 1.43 | 3.08 |
| 4 | −225 | 1.07 | 1.44 | 3.29 |
| 5 | −228 | 1.03 | 1.45 | 3.48 |
| 6 | −229 | 1.13 | 1.42 | 3.27 |
| 7 | −228 | 1.19 | 1.45 | 3.01 |
| *8 | −234 | 1.37 | 1.44 | 2.78 |
| 9 | −220 | 1.05 | 1.45 | 3.18 |
| 10 | −219 | 1.05 | 1.44 | 3.17 |
| 11 | −220 | 1.11 | 1.45 | 3.01 |
| *12 | −205 | 1.33 | 1.43 | 2.21 |
| *13 | −204 | 1.31 | 1.48 | 2.15 |
| *14 | −200 | 1.45 | 1.42 | 1.94 |
| *15 | −205 | 1.29 | 1.18 | 2.76 |
| 16 | −203 | 1.14 | 1.17 | 3.09 |
| 17 | −201 | 1.13 | 1.18 | 3.03 |
| 18 | −215 | 1.42 | 1.12 | 2.91 |

TABLE 1-3

| | Br, I content in material | | | Degree of preferred |
|---|---|---|---|---|
| No. | Br ppm | I ppm | Br/I ratio mol | orientation in C plane % |
| *1 | 840 | <1 | | >99 |
| 2 | 837 | 7 | 189.9 | >99 |
| 3 | 838 | 14 | 95.1 | >99 |
| 4 | 841 | 73 | 18.3 | >99 |
| 5 | 722 | 359 | 3.2 | >99 |
| 6 | 418 | 520 | 1.3 | >99 |
| 7 | 351 | 652 | 0.9 | >99 |
| *8 | <1 | 857 | | >99 |
| 9 | 702 | 210 | 5.3 | >99 |
| 10 | 719 | 338 | 3.4 | >99 |
| 11 | 715 | 250 | 4.5 | >99 |
| *12 | <1 | 610 | | >99 |
| *13 | 625 | <1 | | >99 |
| *14 | <1 | <1 | | >99 |
| *15 | 720 | <1 | | 92 |
| 16 | 704 | 370 | 3.0 | 91 |
| 17 | 722 | 220 | 5.2 | 92 |
| 18 | 722 | 220 | 5.2 | 35 |

As will be clear from Tables 1-1 through 1-3, all samples (Nos. 2 through 7, 9 through 11, 16 and 17) of the Example of the present invention that contains both bromine and iodine have a figure of merit of 3×10$^{-3}$/K or higher. Samples of comparative examples (Nos. 1, 8 and 12 through 15) that are out of the scope of the present invention and do not simultaneously contain Br and I, in contrast, have a figure of merit of 2.82×10$^{-3}$/K or lower, worse than the samples of the present invention. Sample No. 18 having a small degree of preferred orientation in C plane without uniaxial orientation has lower figure of merit than sample No. 17 that is uniaxially oriented.

Now Example 2 and Example 3, that are related to the second embodiment, will be described.

Example 2

In Example 2, various directionally solidified thermoelectric crystalline materials were made.

Stock material powder of Bi$_2$Te$_{2.85}$Se$_{0.15}$ with 0.06% by weight of SbI$_3$ added thereto was prepared as the N type thermoelectric material, and metal powders of Bi, Te, Sb and Se having purity of 99.99% and a SbI$_3$ powder to form the composition of Bi$_{0.5}$Sb$_{1.5}$Te$_3$ were prepared as the P type thermoelectric material.

These powders were weighed and put into a crucible made of carbon that was then closed with a lid. The crucible was put into a quartz tube which was pumped vacuum, and was heated at 800° C. in argon atmosphere for 5 hours, thereby to make melt-refined alloy.

The melt-refined alloy was crushed by a stamp mill in a glove box, and was filtered by a sieve of 2 mm mesh to obtain the alloy powder. Boron nitride, boron carbide and boron oxide were added to the alloy powder in the concentration and state (powder, slurry A through C) shown in Table 1. Then the material with the slurry added thereto was dried and mixed in dry condition in a ball mill for 1 hour, thereby to make the boron-containing alloy powder.

The boron-containing alloy powder was put on top of the square molds made of carbon having space of cylindrical shape measuring 10 mm$^2$ and 2 mm$^2$ in cross sectional area and 100 mm in length, and was melted at a temperature of 800° C. in a single crystal growing apparatus (Bridgman method) having a vertical quartz tube used as the core tube so as to fill the space of the molten metal. Then the mold was cooled down while moving according to the Bridgman method, thereby to grow the crystal under the conditions shown in Table 1 (SP represents the cooling rate) at a temperature near the freezing point (600° C.), thereby to make a long body of N-type and P-type directionally solidified thermoelectric crystalline material having cross sectional areas of 10 mm$^2$ and 2 mm$^2$.

The directionally solidified thermoelectric crystalline material of square shape having cross sectional areas of 10 mm$^2$ was cut to a length of 20 mm in the longitudinal direction, and Seebeck coefficient (S) and specific resistance (ρ) in the longitudinal direction of the rectangular parallelepiped blocks were measured with a commercially available Seebeck coefficient measuring apparatus (ZEM apparatus manufactured by Shinku Riko Co., Ltd.). The block was cut to thickness of 1 mm, of which thermal conductivity (κ) was measured by laser flash method and the figure of merit Z was calculated from the equation $Z=S^2/\rho K$.

The results are shown in Table 2.

TABLE 2-1

| No. | Type | State | Boron compound added Composition | Equivalent content of B wt % |
|---|---|---|---|---|
| *2-1 | P | | No addition | |
| 2-2 | P | Slurry A | BN | 0.01 |
| 2-3 | P | Slurry A | BN | 0.02 |
| 2-4 | P | Slurry A | BN | 0.05 |
| 2-5 | P | Slurry A | BN | 0.1 |
| 2-6 | P | Slurry A | BN | 0.3 |
| 2-7 | P | Slurry A | BN | 0.5 |
| 2-8 | P | Slurry A | BN | 0.7 |
| 2-9 | P | Slurry B | BN | 1 |
| 2-10 | P | Slurry B | BN | 0.05 |
| 2-11 | P | Slurry C | BN | 0.05 |
| 2-12 | P | Powder | BN | 0.05 |
| 2-13 | P | Powder | B4C | 0.05 |
| 2-14 | P | Powder | $B_2O_3$ | 0.05 |
| 2-15 | P | Powder | BN + $B_4C$ | 0.05 |
| *2-16 | N | | No addition | |
| 2-17 | N | Slurry A | BN | 0.01 |
| 2-18 | N | Slurry A | BN | 0.02 |
| 2-19 | N | Slurry A | BN | 0.05 |
| 2-20 | N | Slurry A | BN | 0.1 |
| 2-21 | N | Slurry A | BN | 0.3 |
| 2-22 | N | Slurry A | BN | 0.5 |
| 2-23 | N | Slurry A | BN | 0.7 |
| 2-24 | N | Slurry A | BN | 1 |
| 2-25 | N | Slurry B | BN | 0.05 |
| 2-26 | N | Slurry C | BN | 0.05 |
| 2-27 | N | Powder | BN | 0.05 |
| 2-28 | N | Powder | $B_4C$ | 0.05 |
| 2-29 | N | Powder | $B_2O_3$ | 0.05 |
| 2-30 | N | Powder | $TiB_2$ | 0.05 |

TABLE 2-2

| | Thermoelectric performance | | | | B content |
|---|---|---|---|---|---|
| No. | S μV/K | ρ mΩcm | κ W/mK | 2 $10^{-3}$/K | in material wt % |
| *2-1 | 218 | 1.06 | 1.53 | 2.93 | 0 |
| 2-2 | 222 | 1.06 | 1.47 | 3.16 | 0.01 |
| 2-3 | 225 | 1.07 | 1.43 | 3.31 | 0.02 |
| 2-4 | 229 | 1.08 | 1.39 | 3.49 | 0.05 |
| 2-5 | 220 | 1.07 | 1.38 | 3.28 | 0.1 |
| 2-6 | 218 | 1.08 | 1.36 | 3.24 | 0.3 |
| 2-7 | 216 | 1.09 | 1.34 | 3.19 | 0.5 |
| 2-8 | 204 | 1.09 | 1.27 | 3.01 | 0.7 |
| 2-9 | 203 | 1.1 | 1.24 | 3.02 | 1 |
| 2-10 | 228 | 1.08 | 1.39 | 3.46 | 0.05 |
| 2-11 | 228 | 1.08 | 1.39 | 3.46 | 0.05 |
| 2-12 | 226 | 1.08 | 1.39 | 3.40 | 0.05 |
| 2-13 | 223 | 1.08 | 1.39 | 3.31 | 0.05 |
| 2-14 | 218 | 1.1 | 1.37 | 3.15 | 0.05 |
| 2-15 | 200 | 0.92 | 1.45 | 3.00 | 0.05 |
| *2-16 | −218 | 1.09 | 1.53 | 2.85 | 0 |
| 2-17 | −222 | 1.09 | 1.47 | 3.08 | 0.01 |
| 2-18 | −224 | 1.1 | 1.43 | 3.19 | 0.02 |
| 2-19 | −230 | 1.11 | 1.39 | 3.43 | 0.05 |
| 2-20 | −220 | 1.09 | 1.38 | 3.22 | 0.1 |
| 2-21 | −219 | 1.1 | 1.36 | 3.21 | 0.3 |
| 2-22 | −220 | 1.11 | 1.34 | 3.25 | 0.5 |
| 2-23 | −205 | 1.11 | 1.26 | 3.00 | 0.7 |
| 2-24 | −203 | 1.12 | 1.22 | 3.02 | 1 |
| 2-25 | −227 | 1.11 | 1.39 | 3.34 | 0.05 |
| 2-26 | −227 | 1.11 | 1.39 | 3.34 | 0.05 |
| 2-27 | −227 | 1.11 | 1.39 | 3.34 | 0.05 |
| 2-28 | −223 | 1.11 | 1.39 | 3.22 | 0.05 |
| 2-29 | −218 | 1.14 | 1.37 | 3.04 | 0.05 |
| 2-30 | −199 | 0.88 | 1.5 | 3.00 | 0.05 |

As will be clear from Tables 2-1 and 2-2, all samples Nos. 2-2 through 2-15 and 2-17 through 2-30 of the Example of the present invention that contain a boron compound have figure of merit of $3\times10^{-3}$/K or higher. Samples Nos. 2-1 through 2-16 that are out of the scope of the present invention and do not contain a boron compound, in contrast, have figure of merit of $2.93\times10^{-3}$/K at the best either in P type or N type crystal material, worse than the samples of the present invention.

Example 3

In Example 3, thermoelectric modules were made by using the samples made in the Example 2.

First, the thermoelectric materials of the sample Nos. of Example 2 shown in Table 3 were used to make the directionally solidified thermoelectric crystalline material of square shape having cross sectional areas of 2 mm$^2$ and 100 mm in length, and thermoelectric elements were made from the directionally solidified thermoelectric crystalline material. The thermoelectric elements were used to make the thermoelectric module.

Specifically, the directionally solidified thermoelectric crystalline material was coated with a commercially available plating resist (acrylic resin) on the side face, and was cut off to a length of 0.8 mm by a dicing saw to make the elements of rectangular parallelepiped shape.

After forming Ni plating layer to a thickness of 10 to 30 μm on the elements obtained as described above by electroless plating, Au plating was applied to a thickness of 5 μm. The element was then put into an alkaline solution to remove the plating layer deposited on the plating resist on the side face of the element by ultrasonic cleaning, thereby to form the plating layer only on the cut-off surface thereby to make the thermoelectric element.

Then 127 pairs of thermoelectric elements were disposed on the support substrate measuring 40 mm by 40 mm where wiring conductors were formed by using a grid-shaped assembly jig, and were bonded by soldering, thereby to make the thermoelectric module with lead wires attached to the ends of the terminals. The thermoelectric module thus obtained was supplied with varying electric currents while maintaining the heat dissipating surface temperature constant at 27° C. by means of a water-cooled heat sink, so as to measure the temperature at which the cooling surface temperature becomes lowest, so as to determine the maximum temperature difference (ΔTmax) between the heat dissipating surface temperature and the cooling surface temperature.

The results are shown in Table 3.

TABLE 3

| No. | P-type Sample No. in Table 2 No. | Z $10^{-3}$/K | N-type Sample No. in Table 2 No. | Z $10^{-3}$/K |
|---|---|---|---|---|
| *3-1 | 1 | 2.99 | 16 | 2.91 |
| 3-2 | 4 | 3.49 | 19 | 3.43 |
| 3-3 | 12 | 3.40 | 27 | 3.34 |
| 3-4 | 13 | 3.31 | 28 | 3.22 |
| 3-5 | 14 | 3.15 | 29 | 3.04 |

| No. | Characteristic of thermoelectric module | | |
|---|---|---|---|
| | ΔTmax °C. | Qcmax W | COP % |
| *3-1 | 73 | 41 | 67 |
| 3-2 | 79 | 42 | 75 |
| 3-3 | 77 | 41 | 71 |
| 3-4 | 76 | 42 | 70 |
| 3-5 | 75 | 41 | 69 |

The symbol * indicates sample out of the scope of the present invention.
COP means Qcmax/power consumption (%) when measuring Qmax.

As will be clear from Table 3, samples Nos. 3-2 through 3-5 made by using the directionally solidified thermoelectric crystalline material within the scope of the present invention showed maximum temperature difference (ΔTmax) of 75° C. or more and heat absorption efficiency (COP) of 69% or more. Samples No. 3-1 made by using the directionally solidified thermoelectric crystalline material out of the scope of the present invention showed ΔTmax of 73° C. and COP of 67%, lower than those of the samples of the present invention.

Example 4

Example 4 is related to the third embodiment.

In Example 4, stock material powders of Si, Te, Sb and Se having purity of 99.99% were used to prepare a mixed powder of $Bi_2Te_{2.85}Se_{0.15}$ by adding 0.06% by weight of $SbI_3$ for N-type and $Bi_{0.5}Sb_{1.5}Te_3$ for P type, that were sealed in a quartz tube with argon gas, melted in a rocking furnace while being agitated at a temperature from 800 to 1000° C. for 12 hours. The molten metal was then cooled down and taken out to obtain alloy ingots.

The alloy was subjected to coarse crushing by a stamp mill to particle size of 300 μm or less in a glove box. The coarse powder was further crushed in a vibration mill using IPA as solvent and balls made of silicon nitride for the durations shown in Table 4, and the slurry thus obtained was dried and passed through a sieve of 40 mesh. Particle size distribution of the powder was measured by laser diffraction method, thereby to determine the mean particle size.

Part of the powder described above was pressed in a die measuring 20 mm in diameter with a pressure shown in Table 4 to a thickness of 15 mm. Dimensions and weight of the green compact were measured to determine the density, that was divided by the theoretical density thereby to calculate the relative density of the green compact.

Then the green compact was subjected to firing under normal pressure under the conditions shown in Table 4. Relative density of the normal pressure-sintered material thus obtained was calculated from the specific gravity measured by Archimedes method and the theoretical density. Density difference between the green compact and the normal pressure-sintered material is shown in Table 4 as "Change".

The normal pressure-sintered material was subjected to densification treatment by the method under conditions shown in Table 4. Duration of heating to 200° C. or higher is shown as "Heating" in Table 4.

Samples Nos. 4-19 through 4-23 were made by firing the stock material powder or the green compact by hot press method, and samples Nos. 4-25 and 4-26 were made by firing the powder or the green compact by the PECS method.

Relative density of the normal pressure-sintered material thus obtained was calculated from the specific gravity measured by Archimedes method and the theoretical density.

Samples were made for the measurements of thermal conductivity, Seebeck coefficient and specific resistance in the direction perpendicular to the direction of pressure applied to the dense material when sintering. A disk-shaped sample measuring 10 mm in diameter and 1 mm in thickness was used in for the measurements of thermal conductivity, and a cylindrical sample having square cross section measuring 4 mm by 4 mm by 15 mm was used in the measurements of Seebeck coefficient and specific resistance.

Thermal conductivity was measured by laser flash method and Seebeck coefficient and specific resistance were measured by means of a thermoelectric performance measuring apparatus manufactured by Shinku Riko Co., Ltd., at a temperature of 20° C.

The thermoelectric figure of merit Z was calculated by the equation $Z=S^2/\rho k$ (S is Seebeck coefficient, ρ is resistivity and k is thermal conductivity).

The sample of which thermal conductivity had been measured was subjected to polishing for mirror finish and chemical etching on the surface that was then photographed under SEM to obtain several pictures of such a magnification that allowed it to determine the diameter of the grain. 200 to 300 particles shown in the photographs were taken to determine the mean particle size by the intercept method. The sample used in the measurements of Seebeck coefficient and specific resistance was crushed to measure oxygen content (O content) and carbon content (C content) by an oxygen/nitrogen analyzer and carbon analyzer manufactured by Kariba, Ltd. In addition, one side of a sample 10 mm in diameter was polished to mirror surface, and was tested to measure the strength by biaxial bending test. The results are shown in Tables 4 and 5.

TABLE 4

| | Stock material powder | | |
|---|---|---|---|
| | Type of electrical conductivity | Duration of crushing Hrs | Mean particle size μm |
| *4-1 | P type | 0 | 330 |
| *4-2 | P type | 1 | 120 |
| *4-3 | P type | 2 | 35 |
| 4-4 | P type | 5 | 17 |

TABLE 4-continued

| Sample | Type | | |
|---|---|---|---|
| 4-5 | P type | 10 | 8 |
| 4-6 | P type | 20 | 4 |
| 4-7 | P type | 50 | 3 |
| *4-8 | P type | 20 | 4 |
| 4-9 | P type | 20 | 4 |
| 4-10 | P type | 20 | 4 |
| 4-11 | P type | 20 | 4 |
| 4-12 | P type | 20 | 4 |
| 4-13 | P type | 20 | 4 |
| 4-14 | P type | 20 | 4 |
| 4-15 | P type | 20 | 4 |
| 4-16 | P type | 20 | 4 |
| 4-17 | P type | 20 | 4 |
| 4-18 | P type | 20 | 4 |
| *4-19 | P type | 20 | 4 |
| *4-20 | P type | 20 | 4 |
| *4-21 | P type | 20 | 4 |
| *4-22 | P type | 20 | 4 |
| *4-23 | N type | 20 | 5 |
| 4-24 | N type | 20 | 5 |
| *4-25 | N type | 20 | 5 |
| *4-26 | N type | 20 | 5 |

| | Manufacturing process | | | | | |
|---|---|---|---|---|---|---|
| | Molding | | Firing under normal pressure | | | |
| Sample | Pressure MPa | Density % | Temperature °C. | Duration Hrs | Atmosphere | $H_2$ concentration % |
| *4-1 | 49 | 76 | 450 | 5 | $H_2$ | 100 |
| *4-2 | 49 | 73 | 450 | 5 | $H_2$ | 100 |
| *4-3 | 49 | 68 | 450 | 5 | $H_2$ | 100 |
| 4-4 | 49 | 65 | 450 | 5 | $H_2$ | 100 |
| 4-5 | 49 | 63 | 450 | 5 | $H_2$ | 100 |
| 4-6 | 49 | 61 | 450 | 5 | $H_2$ | 100 |
| 4-7 | 49 | 58 | 450 | 5 | $H_2$ | 100 |
| *4-8 | — | — | 450 | 5 | $H_2$ | 100 |
| 4-9 | 1 | 41 | 450 | 5 | $H_2$ | 100 |
| 4-10 | 5 | 48 | 450 | 5 | $H_2$ | 100 |
| 4-11 | 10 | 52 | 450 | 5 | $H_2$ | 100 |
| 4-12 | 20 | 55 | 450 | 5 | $H_2$ | 100 |
| 4-13 | 49 | 61 | 550 | 0.5 | $H_z$ | 100 |
| 4-14 | 49 | 61 | 525 | 2 | $H_2$ | 100 |
| 4-15 | 49 | 61 | 500 | 5 | $H_2$ | 100 |
| 4-16 | 49 | 61 | 400 | 5 | $H_2$ | 100 |
| 4-17 | 49 | 61 | 350 | 5 | $H_2$ | 100 |
| 4-18 | 49 | 61 | 300 | 5 | $H_2$ | 100 |
| *4-19 | 49 | 61 | 450 | 5 | $H_2$ | 100 |
| *4-20 | 49 | 61 | 450 | 5 | $H_2$ | 100 |
| *4-21 | 49 | 61 | 450 | 5 | $H_2$ | 100 |
| *4-22 | — | — | — | — | — | — |
| *4-23 | 49 | 61 | 450 | 5 | $H_2$ | 100 |
| 4-24 | 49 | 63 | 450 | 5 | $H_2$ | 100 |
| *4-25 | 49 | 63 | — | — | — | — |
| *4-26 | — | — | 450 | 5 | $H_2$ | 100 |

| | Sintered under normal pressure Relative density | | Manufacturing method Densification treatment | | | |
|---|---|---|---|---|---|---|
| Sample No. | Average % | Change % | Method | Temperature °C. | Holding time min | Heating min |
| *4-1 | 92 | 16 | D | 400 | 10 | 16 |
| *4-2 | 90 | 17 | D | 400 | 10 | 16 |
| *4-3 | 88 | 20 | D | 400 | 10 | 16 |
| 4-4 | 85 | 20 | D | 400 | 10 | 16 |
| 4-5 | 83 | 20 | D | 400 | 10 | 16 |
| 4-6 | 83 | 22 | D | 400 | 10 | 16 |
| 4-7 | 81 | 23 | D | 400 | 10 | 16 |
| *4-8 | — | — | D | 400 | 10 | 16 |
| 4-9 | 68 | 27 | D | 400 | 10 | 16 |
| 4-10 | 72 | 24 | D | 400 | 10 | 16 |
| 4-11 | 75 | 23 | D | 400 | 10 | 16 |
| 4-12 | 77 | 22 | D | 400 | 10 | 16 |
| 4-13 | 92 | 31 | D | 400 | 10 | 16 |
| 4-14 | 91 | 30 | D | 400 | 10 | 16 |
| 4-15 | 87 | 26 | D | 400 | 10 | 16 |
| 4-16 | 80 | 19 | D | 400 | 10 | 16 |

TABLE 4-continued

| | | | | | | |
|---|---|---|---|---|---|---|
| 4-17 | 75 | 14 | D | 400 | 10 | 16 |
| 4-18 | 69 | 8 | D | 400 | 10 | 16 |
| *4-19 | 83 | 22 | H | 500 | 120 | 145 |
| *4-20 | 83 | 22 | H | 500 | 60 | 85 |
| *4-21 | 83 | 22 | H | 500 | 30 | 55 |
| *4-22 | — | — | H | 500 | 120 | 145 |
| *4-23 | 83 | 22 | H | 500 | 120 | 145 |
| 4-24 | 81 | 18 | D | 450 | 10 | 17 |
| *4-25 | 63 | — | S | 450 | 10 | 17 |
| *4-26 | — | — | S | 500 | 120 | 145 |

The symbol D represents pulsed electric current heating method, P represents hot press method, and S represents PECS method.

TABLE 5

Properties of dense material 1

| | Relative density % | Particle size μm | C content % by weight | O content % by weight | Strength MPa |
|---|---|---|---|---|---|
| *4-1 | 99.5 | 340 | 0.15 | 0.09 | <1 |
| *4-2 | 99.1 | 130 | 0.15 | 0.1 | <1 |
| *4-3 | 99.3 | 40 | 0.18 | 0.11 | 1 |
| 4-4 | 99.4 | 22 | 0.18 | 0.12 | 11 |
| 4-5 | 99.1 | 11 | 0.19 | 0.13 | 15 |
| 4-6 | 98.8 | 5 | 0.19 | 0.15 | 18 |
| 4-7 | 98.5 | 6 | 0.19 | 0.19 | 22 |
| *4-8 | 97.7 | 5 | 0.35 | 0.33 | 12 |
| 4-9 | 98.1 | 5 | 0.3 | 0.29 | 14 |
| 4-10 | 98.2 | 5 | 0.26 | 0.25 | 15 |
| 4-11 | 98.5 | 5 | 0.2 | 0.18 | 17 |
| 4-12 | 98.6 | 5 | 0.2 | 0.17 | 17 |
| 4-13 | 99.2 | 16 | 0.16 | 0.15 | 12 |
| 4-14 | 99.3 | 11 | 0.16 | 0.15 | 14 |
| 4-15 | 99.5 | 5 | 0.17 | 0.16 | 19 |
| 4-16 | 98.5 | 5 | 0.18 | 0.18 | 18 |
| 4-17 | 98.3 | 5 | 0.2 | 0.25 | 15 |
| 4-18 | 98.1 | 5 | 0.23 | 0.29 | 14 |
| *4-19 | 98.2 | 13 | 0.48 | 0.26 | 9 |
| *4-20 | 97.1 | 10 | 0.39 | 0.24 | 6 |
| *4-21 | 95.8 | 8 | 0.33 | 0.22 | 3 |
| *4-22 | 99.3 | 13 | 0.55 | 0.48 | 3 |
| *4-23 | 98.3 | 12 | 0.33 | 0.22 | 13 |
| 4-24 | 98.2 | 6 | 0.15 | 0.17 | 21 |
| *4-25 | 97.9 | 6 | 0.17 | 0.41 | 20 |
| *4-26 | 99.3 | 6 | 0.41 | 0.23 | 20 |

Properties of dense material 2

| | Thermal conductivity W/mK | Specific resistance $10^{-5}$ Ωm | Seebeck coefficient mV/V | Thermoelectric figure of merit $10^{-3}$/K |
|---|---|---|---|---|
| *4-1 | 1.5 | 0.97 | 197 | 2.67 |
| *4-2 | 1.4 | 0.99 | 198 | 2.83 |
| *4-3 | 1.4 | 1.02 | 200 | 2.80 |
| 4-4 | 1.2 | 1.03 | 201 | 3.27 |
| 4-5 | 1.1 | 1.04 | 203 | 3.60 |
| 4-6 | 1.1 | 1.05 | 205 | 3.64 |
| 4-7 | 1.1 | 1.1 | 208 | 3.58 |
| *4-8 | 1.1 | 1.3 | 195 | 2.66 |
| 4-9 | 1.1 | 1.14 | 198 | 3.13 |
| 4-10 | 1.1 | 1.15 | 200 | 3.16 |
| 4-11 | 1.1 | 1.11 | 202 | 3.34 |
| 4-12 | 1.1 | 1.09 | 205 | 3.51 |
| 4-13 | 1.1 | 0.92 | 179 | 3.17 |
| 4-14 | 1.1 | 0.91 | 182 | 3.31 |
| 4-15 | 1.1 | 1.08 | 206 | 3.57 |
| 4-16 | 1.1 | 1.12 | 205 | 3.41 |
| 4-17 | 1.1 | 1.14 | 204 | 3.32 |
| 4-18 | 1.1 | 1.2 | 203 | 3.12 |
| *4-19 | 1.1 | 1.21 | 203 | 3.10 |
| *4-20 | 1.1 | 1.2 | 191 | 2.76 |
| *4-21 | 1.1 | 1.25 | 191 | 2.65 |
| *4-22 | 1.1 | 1.86 | 198 | 1.92 |
| *4-23 | 1.1 | 1.22 | 203 | 3.07 |
| 4-24 | 1.1 | 1.13 | 210 | 3.55 |
| *4-25 | 1.1 | 1.37 | 209 | 2.90 |
| *4-26 | 1.1 | 1.26 | 201 | 2.91 |

Samples Nos. 4-4 through 4-7, 4-9 through 4-18 and 4-24 of the present invention showed strength of 11 MPa or higher and thermoelectric figure of merit of $3.12 \times 10^{-3}$/K or higher.

Samples Nos. 4-1 through 4-3 that were out of the scope of the present invention made from stock material powder having mean particle size larger than 30 μm, in contrast, showed mean particle size of the dense material exceeding 30 μm and very low strength of 1 MPa.

Sample No. 4-8 that was out of the scope of the present invention made without molding showed carbon content and oxygen content in the dense material both exceeding 0.3% by weight, and accordingly low value of the thermoelectric figure of merit not higher than $2.66 \times 10^{-3}$/K.

Samples Nos. 4-19 through 4-23 that were out of the scope of the present invention made by hot press showed carbon content exceeding 0.3% by weight, strength not higher than 9 MPa and the thermoelectric figure of merit not higher than $3.10 \times 10^{-3}$/K.

Samples Nos. 4-25 and 4-26 that were out of the scope of the present invention made by the PECS method showed carbon content or oxygen content exceeding 0.3% by weight, and the thermoelectric figure of merit not higher than $2.91 \times 10^{-3}$/K.

INDUSTRIAL APPLICABILITY

The thermoelectric material, the thermoelectric element and the thermoelectric module of the present invention have the potential of wide applications for temperature control of laser diode, portable refrigerator, thermostat, photodetector element, semiconductor manufacturing apparatuses, etc. Especially promising are the applications to refrigerator and air conditioner for home use that make advantage of the capability to operate without fluorocarbon, vibration nor noise.

The invention claimed is:

1. A directionally solidified thermoelectric crystalline material comprising:
   one or more crystals comprising at least two elements selected from a group consisting of Bi, Sb, Te and Se, wherein a direction of crystal orientation is uniaxially oriented; and
   one and only one boron compound selected from the group consisting of BN, $B_4C$ and $B_2O_3$, wherein the boron compound is present in an amount of 0.01 to 0.5% by weight of boron element, and wherein the crystalline material is a p-type material.

2. A thermoelectric element comprising the directionally solidified thermoelectric crystalline material according to claim 1.

3. The directionally solidified thermoelectric crystalline material according to claim 1;
   Wherein the at least two elements selected from a group consisting of Bi, Sb, Te and Se are the main component of the directionally solidified thermoelectric crystalline material.

4. The directionally solidified thermoelectric crystalline material according to claim 1;
   Wherein the at least two elements selected from a group consisting of Bi, Sb, Te and Se are the main component of the one or more crystals.

5. The directionally solidified thermoelectric crystalline material of claim 1, wherein the thermoelectric crystalline material has a figure of merit greater than $3.15 \times 10^{-3}$/K.

6. An directionally solidified thermoelectric crystalline material comprising:
   one or more crystals comprising at least two elements selected from a group consisting of Bi, Sb, Te and Se, wherein a direction of crystal orientation is uniaxially oriented; and
   a boron compound selected from the group consisting of BN and $B_4C$, wherein the boron compound is present in an amount of 0.02 to 0.5% by weight of boron element, and
   wherein the crystalline material is an n-type material.

7. The directionally solidified thermoelectric crystalline material according to claim 6, wherein the thermoelectric crystalline material has a figure of merit greater than $3.19 \times 10^{-3}$/K.

* * * * *